US008153512B2

(12) United States Patent
Sirringhaus

(10) Patent No.: US 8,153,512 B2
(45) Date of Patent: Apr. 10, 2012

(54) PATTERNING TECHNIQUES

(75) Inventor: Henning Sirringhaus, Coton (GB)

(73) Assignee: Plastics Logic Limited, Cambridge (GB)

(*) Notice: Subject to any disclaimer, the term of this patent is extended or adjusted under 35 U.S.C. 154(b) by 394 days.

(21) Appl. No.: 11/720,807

(22) PCT Filed: Dec. 5, 2005

(86) PCT No.: PCT/GB2005/004658
§ 371 (c)(1),
(2), (4) Date: Nov. 16, 2007

(87) PCT Pub. No.: WO2006/059143
PCT Pub. Date: Jun. 8, 2006

(65) Prior Publication Data
US 2009/0127588 A1 May 21, 2009

(30) Foreign Application Priority Data
Dec. 3, 2004 (GB) .................................. 0426564.1

(51) Int. Cl.
H01L 21/00 (2006.01)
H01L 21/20 (2006.01)
(52) U.S. Cl. ............... 438/500; 438/501; 257/E21.034; 257/E21.035; 257/E21.036; 257/E21.037; 257/E21.038
(58) Field of Classification Search .................. 257/213, 257/E29.242, E21.034–E21.038; 216/13; 438/500–501
See application file for complete search history.

(56) References Cited

U.S. PATENT DOCUMENTS

| 5,633,191 A * | 5/1997 | Chao ............................. 438/448 |
| 6,117,344 A * | 9/2000 | Cox et al. ...................... 216/11 |
| 6,156,662 A * | 12/2000 | Ohori et al. ................... 438/694 |
| 7,407,899 B2 * | 8/2008 | Wang et al. .................... 442/93 |
| 2004/0029382 A1 * | 2/2004 | Kawase ......................... 438/689 |
| 2004/0229393 A1 * | 11/2004 | Lai et al. ....................... 438/30 |
| 2005/0151820 A1 * | 7/2005 | Sirringhaus et al. ........... 347/107 |

FOREIGN PATENT DOCUMENTS
WO 03/056641 A1 7/2003
WO WO 03056641 A1 * 7/2003

* cited by examiner

Primary Examiner — Zandra Smith
Assistant Examiner — Jeremy Joy
(74) Attorney, Agent, or Firm — Sughrue Mion, PLLC

(57) ABSTRACT

A method of forming a patterned layer, including the steps of: (i) depositing via a liquid medium a first material onto a substrate to form a first body on said substrate; (ii) depositing via a liquid medium a second material onto said substrate to form a second body, wherein said first body is used to control said deposition of said second material so as to form a patterned structure including said first and second bodies; and (iii) using said patterned structure to control the removal of selected portions of a layer of material in a dry etching process or in a wet etching process using a bath of etchant.

11 Claims, 3 Drawing Sheets

PATTERNING TECHNIQUES

This invention relates to patterning techniques, particularly but not exclusively to wet and dry etching techniques for forming patterned elements of electronic devices.

Conventional wet and dry etching techniques involve spin-coating a layer of resist material on a substrate, patterning it by photolithography, and using the patterned resist layer as a mask in a wet etching process or a dry etching process. In such conventional processes the resist film is deposited by spin coating of a continuous resist film and patterned by lithography, for example UV or electron beam light exposure through a photomask followed by removal portions of the resist layer in a developer solution. Another technique involves lift-off of a functional layer using the resist pattern as a mask.

Printing has also been used to fabricate a resist pattern which can be used for wet or dry etching of a functional material (Arias, et al., Applied Physics Letters—Oct. 11, 2004—Volume 85, Issue 15, pp. 3304-3306). In this case a resist layer is directly written in an additive manner onto the substrate using techniques such as inkjet offset. This provides a simpler process, but has an important drawback which is that the pattern resolution which can be achieved in this way is limited by the relatively poor resolution of current printing techniques which is typically on the order of 20 µm or worse. If one attempts, for example, to define a narrow opening in a resist pattern which a linewidth dimension of less than 20 µm there is a high risk that electrical shorts (etching process) or linebreaks (lift-off process) will result because the printed resist pattern will have defects where two portions of the resist pattern will touch. Using the techniques disclosed in the prior art it is not possible to use printing for definition of features with resolution of a few µm or higher.

The present invention provides a method by which high-resolution definition of a printed resist pattern with micrometer or submicrometer resolution can be achieved. The invention is based on the self-aligned printing technique described in WO03/056641, whose entire content is incorporated herein by reference. The self-aligned printing technique was previously used for additive high-resolution patterning of a functional material. Here we disclose that it can also be used in a subtractive mode for high-resolution patterning of a resist material followed by conventional etching.

According to one aspect of the invention, there is provided a method for patterning a functional material on a substrate comprising the steps of: depositing a liquid of a first composition on a first region of the substrate to form a first body of a first resist material; subsequently depositing a liquid of a second composition on a second region of the substrate to form a second body of resist material, adjacent the first region; and transferring the pattern defined in the resist material into the functional material; wherein the first composition, the second composition and the substrate are such that on deposition of the liquid of the second composition it is repelled from the first region and dries in such a way that the first resist material is spaced from the second resist material and the shortest distance between the first resist material and the second resist defines a feature of the pattern of the functional material.

In one embodiment, the step of transferring the pattern defined in the resist material into the functional material comprises a dry etching process or a wet etching process using a bath of etchant or a lift-off process to pattern the functional material.

In one embodiment said feature is the gap distance between two separate regions of the functional material; wherein said gap distance may be less than 10 µm, particularly, less than 1 µm, and more particularly, less than 100 nm. The gap distance may define the channel length of an electronic switching device.

In one embodiment, the step of etching the functional material involves wet etching.

In one embodiment, the step of etching the functional material involves dry etching.

In one embodiment, said functional material is a conductive or semiconductive material.

In one embodiment, said functional material is an inorganic metal.

In one embodiment, said functional material is another resist material, and the step of etching said another resist material produces an overhanging profile of said first and second resist material on top of said another resist material.

In one embodiment, the step of transferring the pattern defined in the resist material into the functional material involves lifting the functional material off the substrate.

In one embodiment, said feature is the linewidth of said pattern of functional material, wherein said linewidth may be less than 10 µm, particularly less than 5 µm, and more particularly less than 1 µm.

In one embodiment, said functional material is a conductive or semiconductive material.

In one embodiment, said functional material is an inorganic metal.

In one embodiment, said pattern of functional material is a pattern of metallic interconnect lines.

In one embodiment, the liquid of the second composition is deposited in contact with the first body of resist material and forms a second body of resist material not in contact with the first body.

In one embodiment, the liquid of the second composition is deposited in contact with the first body of resist material and forms a second body of resist material in contact with the first body.

In one embodiment, at least one of said first or second resist materials is an insulating polymer.

In one embodiment, at least one of said first or second resist materials is a photoresist material.

In one embodiment, said first and second resist material are of essentially identical composition.

According to another aspect of the present invention, there is provided a method for patterning a conducting or semiconducting material on a substrate comprising the steps of: depositing a liquid of a first composition on a first region of the substrate to form a first body of a first resist material; subsequently depositing a liquid of a second composition on a second region of the substrate to form a second body of resist material, adjacent the first region; and transferring the pattern defined in the resist material into the conducting or semiconducting material; wherein the first composition, the second composition and the substrate are such that on deposition of the liquid of the second composition it is repelled from the first region and dries in such a way that the first resist material is spaced from the second resist material and the shortest distance between the first resist material and the second resist defines a feature of the pattern of the conducting or semiconducting material.

According to another aspect of the present invention, there is provided a method for patterning a resist material on a substrate comprising the steps of: depositing a liquid of a first composition on a first region of the substrate to form a first body of a first resist material; subsequently depositing a liquid of a second composition on a second region of the substrate to form a second body of resist material, adjacent the first region; and transferring the pattern defined in the resist material into a resist material; wherein the first composition, the second composition and the substrate are such that on deposition of the liquid of the second composition it is repelled from the first region and dries in such a way that the first resist material is spaced from the second resist material and the shortest distance between the first resist material and the second resist defines a feature of the pattern of the resist material.

According to another aspect of the present invention, there is provided an electronic device, such as for example a transistor, made by a method as set out above.

According to another aspect of the present invention, there is provided a method of forming a patterned layer, including the steps of: (i) depositing via a liquid medium a first material onto a substrate to form a first body on said substrate; (ii) depositing via a liquid medium a second material onto said substrate to form a second body, wherein said first body is used to control said deposition of said second material so as to form a patterned structure including said first and second bodies; and (iii) using said patterned structure to control the removal of selected portions of a layer of material in a dry etching process or in a wet etching process using a bath of etchant.

According to another aspect of the present invention, there is provided a method of forming a patterned conducting or semiconducting layer, including the steps of: (i) depositing via a liquid medium a first material onto a substrate to form a first body on said substrate; (ii) depositing via a liquid medium a second material onto said substrate to form a second body, wherein said first body is used to control said deposition of said second material so as to form a patterned structure including said first and second bodies; and (iii) using said patterned structure to control the removal of selected portions of a layer of conducting or semiconducting material.

In one embodiment, said first and second bodies define a first gap therebetween via which said substrate is exposed and which has a width of less than 10 microns.

According to another aspect of the present invention, there is provided a method of forming a patterned layer, including the steps of: (i) depositing via a liquid medium a first material onto a substrate to form a first body on said substrate; (ii) depositing via a liquid medium a second material onto said substrate to form a second body, wherein said first body is used to control said deposition of said second material so as to form a patterned structure including said first and second bodies; and (iii) using said patterned structure using said patterned structure as a mask during a process of etching said substrate, wherein said process of etching said substrate is carried out so as to underetch the first and second bodies so as to define in said substrate a second gap of greater width than said first gap, and further including the step of subsequently using said patterned structure as a mask to selectively deposit a third material into the portion of said second gap exposed by said first gap.

According to another aspect of the present invention, there is provided a method of forming a patterned layer, including the steps of: (i) depositing via a liquid medium a first material onto a substrate to form a first body on said substrate; (ii) depositing via a liquid medium a second material onto said substrate to form a second body, wherein said first body is used to control said deposition of said second material so as to form a patterned structure including said first and second bodies; and (iii) forming a layer of a third material over said patterned structure and said substrate, and dissolving the first and second bodies so as to selectively detach from the substrate those portions of the layer of third material overlying the first and second bodies.

In one embodiment, the first body is used to provide support for a layer that is more repellent to said liquid medium carrying said second material than said substrate.

In one embodiment, said first and second materials have the same composition.

In one embodiment, the patterned structure is used to define a feature of an electronic device.

According to another aspect of the present invention, there is provided a method of forming a patterned resist layer, including the steps of: (i) depositing via a liquid medium a first material onto a substrate to form a first body on said substrate; (ii) depositing via a liquid medium a second material onto said substrate to form a second body, wherein said first body is used to control said deposition of said second material so as to form a patterned structure including said first and second bodies; and (iii) using said patterned structure to control the removal of selected portions of a layer of resist material.

According to another aspect of the present invention, there is provided the use of a method as set out above in the production of an electronic device.

According to one embodiment small, micron or submicrometer size gap as well as narrow linewidth structures can be defined in a functional material by additive direct-write patterning of a resist material and subsequent transfer of the pattern of the resist material into the functional material.

According to one embodiment, a subtractive patterning mode of self-aligned printing (SAP) is used to define a narrow gap structure in a resist material, and transferring the pattern of the resist material into a functional material either using an etching process to define a small gap, or using a lift-off process to define a small linewidth structure.

In one embodiment, self-aligned printing is used to pattern a conventional resist layer, which is used in a subsequent, conventional wet or dry etching or lift-off patterning step to pattern subtractively a layer of functional material.

According to one embodiment of the invention, a functional material is deposited prior to the step of printing a resist material, and is patterned in an etching step using the SAP patterned resist pattern as an etch mask. The functional material is a conductive or semiconductive material, and the etching step is used to define a narrow gap structure separating two regions of the functional material from each other. Preferably the gap dimension is less than 10 µm, more preferably less than 1 µm, most preferably less than 100 nm.

According to another embodiment of the present invention, a functional material is deposited after the step of printing the resist material, and is patterned in a lift-off step using a SAP patterned resist pattern to remove the functional material in those regions covered by the resist material. The functional material is a conductive or semiconductive material, and the etching step is used to define a narrow linewidth structure. Preferably the linewidth is less than 10 µm, more preferably less than 5 µm, most preferably less than 1 µm.

Embodiments of the invention are described hereunder, by way of example only, with reference to the following drawings, in which.

EXAMPLE 1

Subtractive Patterning of Narrow Gap Structures by Self-Aligned Printing

Figure 1:
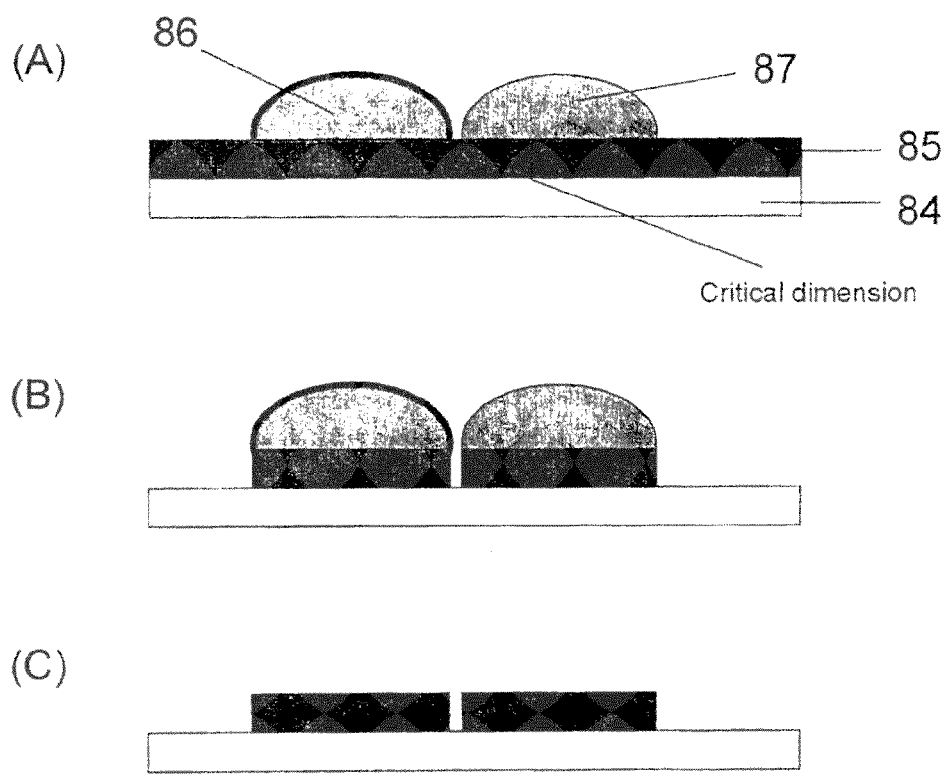
FIG. 1 shows the application of a self-aligned printing technique for patterning a resist layer used to etch a small gap feature into an underlying layer according to a first embodiment of the present invention.

A self-aligned printing (SAP) technique is used in a subtractive patterning mode to define an etch mask for narrow gap patterning of a functional material. FIG. 1 shows a process for defining a small gap structure in a functional material 85 deposited as a continuous layer or coarsely patterned structure on a substrate 84. On top of the layer 85 a resist material is patterned using a SAP technique by printing a first resist structure 86, preparing the surface of the first resist structure in such a way that the ink of a second resist structure 87 is repelled by the surface of the first resist structure to form a small self-aligned gap between the two resist structures. This can be achieved by any of the self-aligned printing techniques described in WO03/056641, whose entire content is incorporated herein by reference. Then the substrate is subjected to an etching treatment, which may be either a wet chemical etching treatment involving immersing the substrate in a bath of etchant, or a dry etching treatment. During the etching step the resist material protects the underlying functional material from the etching process, and the functional material is removed from the substrate in those regions where the resist is not present, i.e. in the short SAP gap formed between portions 86 and 87 of the resist material.

The dry etching treatment may involve sputtering the functional material using reactive ions or dissolving the functional material using a vapour-phase etchant. One example of dry etching is $O_2$ plasma etching.

The size of the gap which is defined in this way depends on several factors:

The dimension of the SAP gap which can be influenced by any of the techniques described in WO03/056641.

The etching conditions. For example, underetching and gap widening can be achieved by using a non-directional etch, such as an anisotropic wet etch and increasing the time for the etching beyond what is necessary to remove the functional material from the substrate in the region of the SAP gap in the resist material.

By making use of the thickness profile of the resist pattern, which is becoming thinner towards the SAP gap, and by choosing an etching process that is able to remove not only the functional material, but also has a lower, but finite etch rate for the resist material. The etching conditions can be adjusted such that the functional material is removed also in those regions where the resist is so thin that it is removed during the etching process. Since the profile of the resist layer exhibits decreasing thickness towards the SAP gap, the width of the gap in the functional material can be adjusted by varying the etching time. The longer the etching time is chosen, the wider the removed resist region around the SAP gap and the wider the gap in the functional material will be. Note that in this mode of the SAP technique electrical isolation between the two resist structures 86 and 87 is not necessarily required.

The resist material can be formed from any printable material which shows good etching resistance in the etch process used to pattern the functional material. For example, resist materials that are currently used for photolithographic patterning and can be formulated into a printable ink can be used. If the functional material is a conductive metal, such as a film of inorganic metal such as gold, or a solution-processed and sintered metal film such as nanoparticle gold or silver, the resist might be an insulating polymer material that is resistant against acid etching, such as a conventional photoresist resin, such as a PMMA or novolac resin. The resist material might be heated or cross-linked in order to improve its etch resistance. To achieve the repulsive surface modification of the first body of resist a surface treatment of the first resist pattern, for example using a surface fluorination step in a $CF_4$ plasma prior to deposition of the second resist structure, or other techniques as disclosed in WO03/056641 might be used.

After the etching process the resist material may be removed from the substrate to uncover the surface of the unetched portions of the functional material.

This method can be used to define small gap structures in many materials such as organic or inorganic metals and organic or inorganic semiconductors. It is applicable to patterning of continuous or coarsely pre-patterned films of solution-processed conductors, such as conducting polymers or solution-processable nanoparticle or precursor metals. It is particularly applicable to functional materials that are themselves not amenable to solution-based/printing-based patterning. This includes many inorganic metals such as evaporated films of gold or chromium. Applications of this technique include, but are not limited to, patterning of metal source-drain electrodes for organic TFTs, as well as patterning of source-drain electrodes for inorganic semiconductor TFTs as well as MOSFETs. An attractive feature of this method is that it does not rely on surface modification of the functional material. This can be an advantage for materials/device structures for which the step of preparing the surface of the first material to repel the ink of the second material has an adverse effect on the electronic properties of the device, such as for example, the charge injecting properties if the first material is to be used as an electrode in contact with a semiconducting layer.

The above technique is applicable to all photolithographic resist processes in the prior art which are based on using a resist material to protect portions of previously deposited functional layer during an etching step. The resist material needs to be formulated into an ink which is suitable for patterning by the SAP technique.

EXAMPLE 2

Subtractive Patterning of Narrow Linewidth Structures by Self-Aligned Printing

Figure 2:
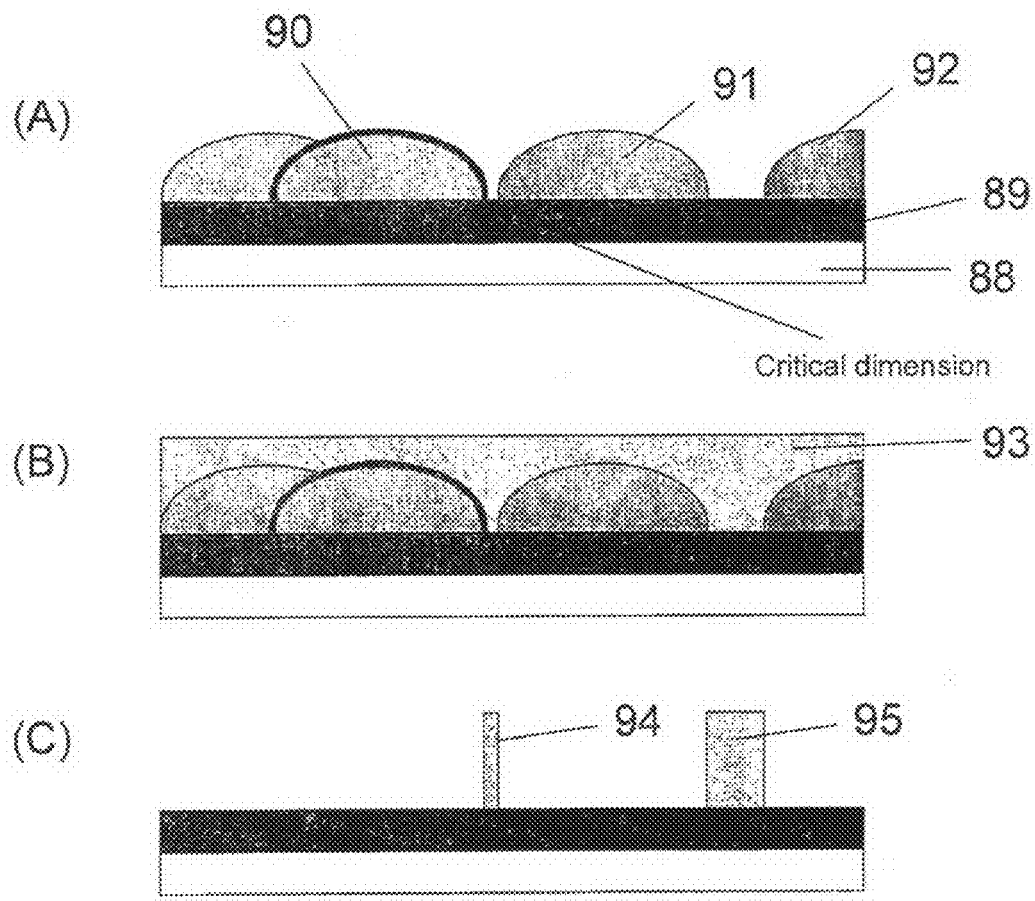
FIG. 2 shows the application of a self-aligned printing technique for patterning a resist layer used to lift-off pattern a small linewidth structure according to a second embodiment of the present invention.

An SAP technique is used in a subtractive patterning mode to define small linewidth structures. This is illustrated in FIG. 2. A resist pattern is defined with the help of an SAP technique on a substrate 88, that may already contain a sequence of functional layers. On top of the substrate layer 89 a resist material is patterned using a SAP technique by printing a first resist structure 90, modifying the surface of the first resist structure in such a way that the ink of a second resist structure 91 is repelled by the surface of the first resist structure to form a small self-aligned gap between the two resist structures. This can be achieved by any of the self-aligned printing techniques described in WO03/056641, whose entire content is incorporated herein by reference. Then a layer of functional material 93 is deposited on top of the resist structure. This layer may either be deposited from solution, or by conventional vacuum deposition techniques. The layer may for example be a layer of inorganic metal deposited by vacuum deposition techniques, or a solution processable metal deposited by spin coating.

Subsequently, the substrate is subject to a lift-off patterning step during which the substrate is immersed in a solvent in which the resist material is soluble, but not the functional material. When the resist material is dissolved, the functional material is removed in all regions located on top of resist material, and remains on the substrate only in those regions in which the functional material was able to get in contact directly with the substrate.

The ability to lift-off the functional materials depends on a variety of factors:

The thickness profile of the two portions 90, 91 of the resist pattern, which can be influenced by the ink formulation, print and drying conditions for the resist patterning as described above. For certain functional materials it will be desirable to define a steep edge profile in order to achieve a reduction of the thickness of the deposited layer of functional material, which facilitates the break-up of the functional layer during the lift-off.

The thickness and mechanical properties of the functional material

The relative adhesion of the functional material to the substrate compared to its adhesion to the resist material. Care needs to be taken that the adhesion of the functional material to the bare substrate is strong enough to prevent the functional layer being delaminated from the bare substrate region, when the neighbouring portions of the film on top of the resist regions are removed from the substrate.

In this lift-off mode the SAP gap defines a line of narrow linewidth 94. Wider gaps in the resist pattern can be used to define patterns with wider linewidth 95.

This method can be used to define narrow lines in many materials such as organic or inorganic metals and organic or inorganic semiconductors, including those materials which are themselves not amenable to patterning by direct-write printing. Applications of this technique include, but are not limited to, narrow linewidth conductors and interconnects for integrated circuits, large-area electronic circuits, such as displays, based on organic as well as inorganic semiconductors.

The above technique is applicable to all lift-off resist patterning processes in the prior art which are based on using a resist material to remove portions of a subsequently deposited functional layer during resist dissolution step.

In both modes of operation further structures may be defined in the resist material on the substrate such as wider gaps/linewidth structures defined by printing different portions of the resist structure, such as element 92 in FIG. 2, at a significant distance from each other. This is using the conventional ability of additive printing to define an arbitrary, coarsely patterned resist layer on the substrate.

Figure 3:
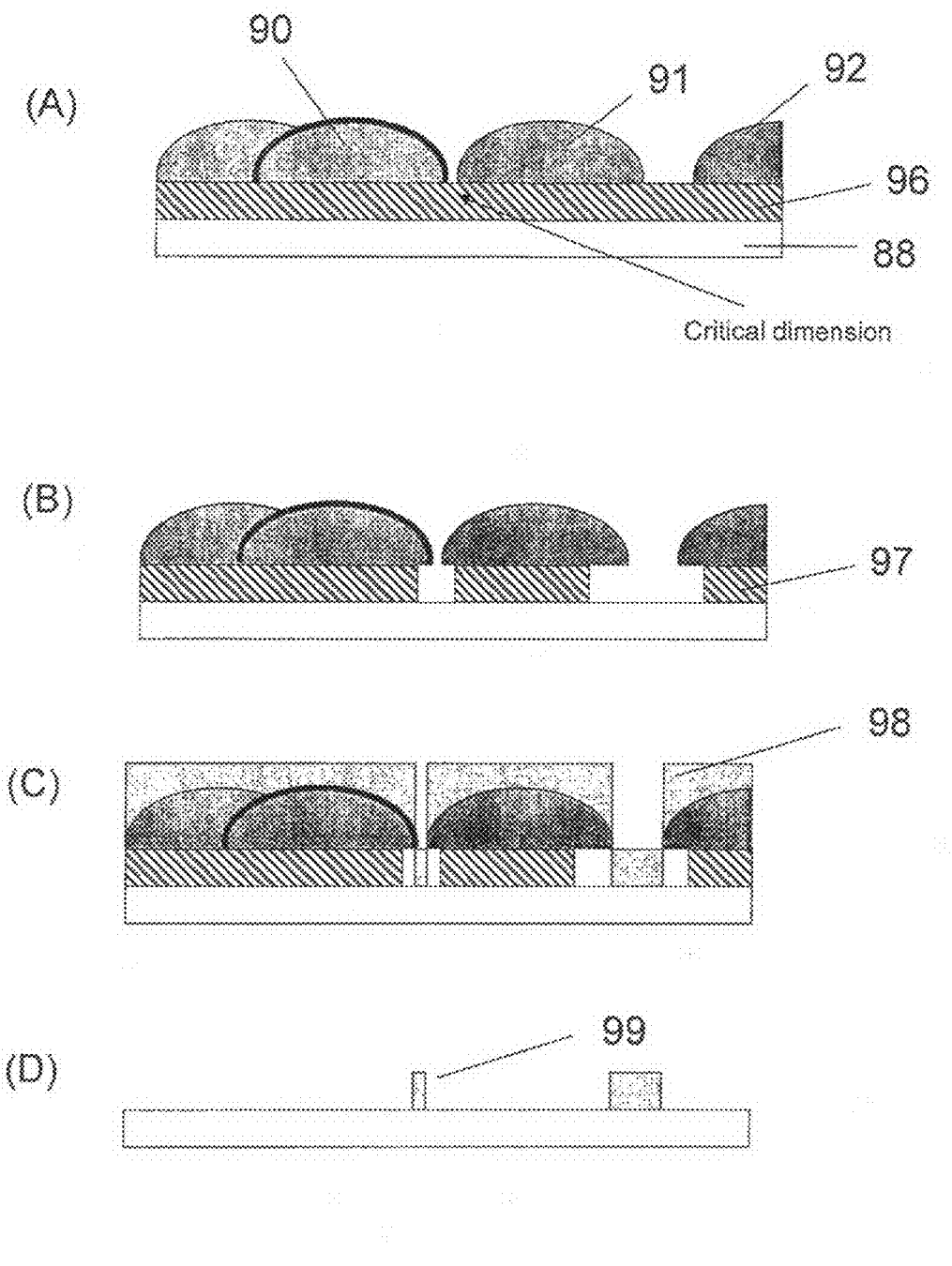
FIG. 3 shows another method for patterning a small linewidth structure according to a third embodiment of the present invention.

The two methods described above can also be used in combination. FIG. 3 illustrates a dual-layer resist process which is able to produce a tapered profile in a lift-off patterned functional material. An etching process is used in a first step to pattern a continuous second resist layer 96 deposited prior to the step of printing of the resist layer 90/91/92. By using etching conditions which underetch the second resist layer, but do not etch or not significantly etch the first resist material an overhanging profile is produced at the edge of the resist pattern 97. When the functional material 98 is deposited as thin film, for example by vacuum evaporation, the film is deposited as a discontinuous pattern. The portion of the film deposited in the gap region has a tapered edge with reduced thickness towards its edge. The discontinuity of the film across the boundary between the bare substrate and the resist pattern provides for both easier lift-off patterning as well as potentially improved electronic and mechanical properties of the patterned functional line 99.

These methods can, for example, be used in the production of electronic devices such as thin-film transistors (TFTs). TFTs fabricated using the methods described above may be part of a more complex circuit or device in which one or more such devices can be integrated with each other and or with other devices. Examples of applications include logic circuits and active matrix circuitry for a display or a memory device, or a user-defined gate array circuit.

The methods described above may also be used to pattern other components of such circuit as well, such as interconnects, resistors, capacitors etc.

Other examples of potential applications of the above-described methods are in conventional graphic arts printing, whenever narrow gaps between two printed patterns are required, or printed patterns with a narrow width.

The above-described methods are, for example, useful for defining the source and drain electrodes of a TFT separated by a channel length of less than 10 µm.

The method is applicable to a range of printing techniques by which the resist pattern can be deposited, including but not limited to, inkjet printing, offset, gravure, and/or screen printing.

The functional layer can be deposited by any technique including conventional vacuum deposition, such as evaporation or sputtering, or liquid-based deposition techniques, such as spin-coating or large-area deposition by printing.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method for patterning a functional material on a substrate comprising:
   depositing a liquid of a first composition on a first region of the substrate to form a first body of a first resist material;
   subsequently depositing a liquid of a second composition on a second region of the substrate to form a second body of resist material, adjacent the first region; and
   transferring the pattern defined in the resist material into the functional material, wherein the first composition, the second composition and the substrate are such that the liquid of the second composition is repelled from the first region and dries in such a way that the first resist material is spaced from the second resist material, wherein the step of transferring the pattern defined in the resist material into the functional material comprises a dry etching process or a wet etching process using a bath of etchant to pattern the functional material, wherein said functional material is another resist material, and wherein the step of etching said another resist material produces an overhanging profile of said first and second resist material on top of said another resist material.

2. A method as claimed in claim 1, wherein said gap distance is less than 10 µm.

3. A method as claimed in claim 1, wherein said gap distance is less than 1 µm.

4. A method as claimed in claim 1, wherein said gap distance is less than 100 nm.

5. A method as claimed in claim 1, wherein the liquid of the second composition is deposited in contact with the first body of resist material and forms a second body of resist material not in contact with the first body.

6. A method as claimed in claim 1, wherein at least one of said first or second resist materials is an insulating polymer.

7. A method as claimed in claim 1, wherein at least one of said first or second resist materials is a photoresist material.

8. A method as claimed in claim 1, wherein said first and second resist material are of essentially identical composition.

9. A method of producing an electronic device comprising a method according to claim 1.

10. A method as claimed in claim 9, wherein said electronic device is a transistor.

11. A method according to claim 1, wherein said first and second materials have the same composition.

* * * * *